US008862962B2

(12) United States Patent
Zhang et al.

(10) Patent No.: US 8,862,962 B2
(45) Date of Patent: Oct. 14, 2014

(54) LAYERED DECODER ENHANCEMENT FOR RETAINED SECTOR REPROCESSING

(71) Applicant: LSI Corporation, Milpitas, CA (US)

(72) Inventors: Fan Zhang, Milpitas, CA (US); Jun Xiao, Fremont, CA (US)

(73) Assignee: LSI Corporation, San Jose, CA (US)

( * ) Notice: Subject to any disclaimer, the term of this patent is extended or adjusted under 35 U.S.C. 154(b) by 44 days.

(21) Appl. No.: 13/644,181

(22) Filed: Oct. 3, 2012

(65) Prior Publication Data

US 2014/0095961 A1    Apr. 3, 2014

(51) Int. Cl.
*H03M 13/00* (2006.01)
(52) U.S. Cl.
USPC ............................ 714/758; 714/769; 714/766
(58) Field of Classification Search
CPC ...................................................... H03M 13/09
USPC .................... 714/758, 769, 766, 763, 770, 20
See application file for complete search history.

(56) References Cited

U.S. PATENT DOCUMENTS

| | | | | |
|---|---|---|---|---|
| 5,920,441 | A * | 7/1999 | Cunningham et al. | 360/78.05 |
| 6,128,698 | A * | 10/2000 | Georgis | 711/111 |
| 7,047,438 | B2 * | 5/2006 | Smith et al. | 714/6.13 |
| 8,495,449 | B2 | 7/2013 | Gunnam | |

OTHER PUBLICATIONS

Gunnman, Kiran K., Comments on "Techniques and Architectures for Hazard-Free Semi-Parallel Decoding of LDPC Codes", EURASIP Journal on Embedded Systems, 2009, pp. 1-3, vol. 2009, Article 704174, Hindawi Publishing Corporation.
Kiran K. Gunnam, Gwan S. Choi, Mark B. Yeary, "Value-Reuse Properties of Min-Sum for GF(q)", Texas A&M Technical Note, report dated Oct. 2006, Available for unrestricted access since Jul. 2008 at IEEE SSCS SCV Website.
Kiran K. Gunnam, "Next Generation Iterative LDPC Solutions for Magnetic Recording Storage", Invited presentation at 42nd Asilomar Conference on Signals, Systems and Computers, Oct. 2008.

* cited by examiner

*Primary Examiner* — Fritz Alphonse
(74) *Attorney, Agent, or Firm* — Hamilton DeSanctis & Cha

(57) ABSTRACT

A system is described for recovering data from a number of sectors, such as the sectors of a hard disk drive (HDD) disk platter, and so forth. The system receives data from the sectors via a read channel and uses a layered data decoder to recover data from the sectors. A memory is coupled with the processor and configured to retain data received from one or more of the sectors, e.g., in retained sector reprocessing (RSR) embodiments. The system is configured to update messages in different circulant layers of the data decoder's parity-check matrix. The system uses one message update order in a processing iteration, and different message update orders in subsequent reprocessing iterations. In some embodiments, layer reordering is used for RSR. In some embodiments, circulant reordering is used for RSR.

21 Claims, 5 Drawing Sheets

LAYERED DECODER ENHANCEMENT FOR RETAINED SECTOR REPROCESSING

BACKGROUND

Various data processing systems have been developed including storage systems, cellular telephone systems, and radio transmission systems. In such systems, data is transferred from a sender to a receiver via a medium. For example, in a storage system, data is sent from a sender (e.g., a write function) to a receiver (e.g., a read function) via a storage medium. A data processing function uses a data decoder circuit configured to recover originally written data, such as a data decoder included with a read channel circuit that employs information divergence based data processing circuitry. A layered decoder can be used to provide more effective trapping set handling, but may also have slower convergence. For example, in a layered decoder, a parity-check matrix can be divided into an integer number of layers, N, and an integer number of circulants, M, where message updates follow a predetermined order. The decoder first updates messages in the first layer, then messages in the second layer, and then messages in each subsequent layer through the $N^{th}$ layer. Within each layer, the decoder updates the messages within each circulant one at a time, and processes the circulants sequentially in a predetermined order, such as from left to right.

SUMMARY

A system is described for recovering data from a number of sectors, such as the sectors of a storage medium. The system receives data from the sectors via a read channel and uses a layered decoder to recover data from the sectors. In some embodiments, the system receives data in the form of sensed magnetic signals from the disk platter of a HDD and recovers data by recreating the information originally written to the disk platter. A memory is coupled with the processor and configured to retain data received from one or more of the sectors. The system is configured to update messages in different circulant layers of the decoder's parity-check matrix. The system uses one message update order in a processing iteration, and different message update orders in subsequent reprocessing iterations. In some embodiments, layer reordering is used for retained sector reprocessing. In some embodiments, randomized reordering is used to reorder layers in the reprocessing stage of retained sector reprocessing. Additionally, error event based reordering is used in some embodiments to reorder message updates for layers in the reprocessing stage of retained sector reprocessing. In some embodiments, circulant reordering is used for retained sector reprocessing. In a particular example, randomized reordering is used to reorder the circulants in a layer. Additionally, in embodiments of the disclosure symbol log likelihood ratio (LLR) quality based reordering is used to reorder message updates for circulants within a particular layer in the reprocessing state of retained sector reprocessing.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

DETAILED DESCRIPTION

Figure 1:
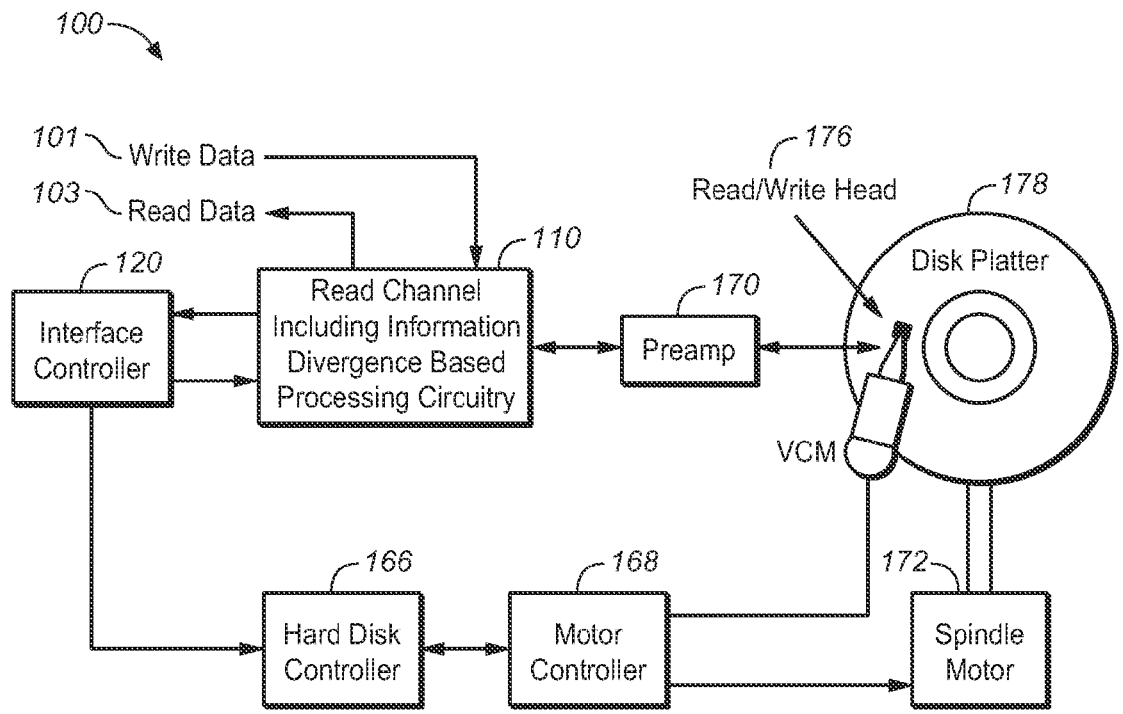
FIG. 1 is a block diagram that illustrates a storage system having information divergence based data processing circuitry in accordance with embodiments of the disclosure.

In FIG. 1 a storage system 100 is illustrated. The storage system 100 includes a read channel circuit 110 that employs information divergence based data processing circuitry in accordance with embodiments of the disclosure. In some embodiments, the storage system 100 is, for example, a hard disk drive (HDD). As shown, the storage system 100 includes a preamplifier 170, an interface controller 120, a hard disk controller 166, a motor controller 168, a spindle motor 172, a disk platter 178, and a read/write head assembly 176. The interface controller 120 controls addressing and timing of data to the disk platter 178 during a write operation and from the disk platter 178 during a read operation. Interface controller 120 also interacts with a host controller that includes out of order constraint command circuitry. The data on the disk platter 178 includes groups of magnetic signals that are detected by the read/write head assembly 176 when the assembly is property positioned over disk platter 178. In embodiments of the disclosure the disk platter 178 includes magnetic signals recorded in accordance with either a longitudinal or a perpendicular recording scheme.

In a typical read operation, the read/write head assembly 176 is accurately positioned by the motor controller 168 adjacent a desired data track on the disk platter 178. In some embodiments, the read/write head assembly 176 is positioned using a voice coil motor actuator VCM. The motor controller 168 positions the read/write head assembly 176 in relation to the disk platter 178 and drives the spindle motor 172 by moving the read/write head assembly 176 to the proper data track on the disk platter 178 under the direction of the hard disk controller 166. The spindle motor 172 spins the disk platter 178 at a determined spin rate (e.g., at a determined number of revolutions per minute (RPM)). Once the read/write head assembly 176 is positioned adjacent to the proper data track, magnetic signals representing data on the disk platter 178 are sensed by the read/write head assembly 176 as the disk platter 178 is rotated by the spindle motor 172. The sensed magnetic signals are provided as a continuous, minute analog signal representative of the magnetic data on the disk platter 178. This minute analog signal is transferred from the read/write head assembly 176 to the read channel circuit 110 via a preamplifier 170. The preamplifier 170 is operable to amplify the minute analog signals accessed from the disk platter 178. In turn, the read channel circuit 110 decodes and digitizes the received analog signal to recreate the information originally written to the disk platter 178. This data is provided as read data 103 to a receiving circuit. A write operation is substantially the opposite of the preceding read operation with write data 101 being provided to the read channel circuit 110. This data is then encoded and written to the disk platter 178.

As part of processing the received information, read channel circuit 110 applies a data detection algorithm to the received data set to yield a detected output. Soft information from the detected output is used to calculate a quality metric. In some embodiments, the quality metric is an information divergence. Later applications of the data detection algorithm and a data decode algorithm are prioritized based at least in part on the quality metric. In some embodiments, the read channel circuit is implemented similar to that discussed in relation to FIG. 3 below and/or operate similar to the methods discussed below in relation to FIGS. 4A and 4B.

It should be noted that in some embodiments, the storage system 100 is integrated into a larger storage system such as, for example, a RAID (redundant array of inexpensive disks or redundant array of independent disks) based storage system. RAID storage systems increase stability and reliability through redundancy, combining multiple disks as a logical unit. In this manner, data is spread across a number of disks included in the RAID storage system according to a variety of algorithms and accessed by an operating system as if the RAID storage system were a single disk drive. For example, in embodiments of the disclosure data is mirrored to multiple disks in the RAID storage system, or is sliced and distributed across multiple disks using a number of techniques. If a small number of disks in the RAID storage system fail or become unavailable, error correction techniques are used to recreate the missing data based on the remaining portions of the data from the other disks in the RAID storage system. The disks in the RAID storage system can be, but are not necessarily limited to, individual storage systems such as storage system 100, and can be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk drive.

In embodiments of the disclosure, a data decoder circuit used in relation to read channel circuit 110 comprises, but is not necessarily limited to, a low density parity check (LDPC) decoder circuit. Low density parity check technology is applicable to transmission of information over various channels and/or information storage systems on various media. Transmission applications include, but are not necessarily limited to: optical fiber, radio frequency channels, wired or wireless local area networks, digital subscriber line technologies, wireless cellular, Ethernet over various mediums such as copper or optical fiber, cable channels such as cable television, and Earth-satellite communications. Storage applications include, but are not necessarily limited to: hard disk drives, compact disks, digital video disks, magnetic tapes and memory devices such as DRAM, NAND flash, NOR flash, other nonvolatile memories and solid state drives.

In addition, it should be noted that in some embodiments, the storage system 100 is configured to include solid state memory to store data in addition to the storage offered by the disk platter 178. In embodiments of the disclosure, solid state memory is used in parallel to the disk platter 178 to provide additional storage. The solid state memory receives and provides information directly to the read channel circuit 110. Additionally, in some embodiments the solid state memory is used as a cache, e.g., to provide faster access time than that offered by the disk platter 178. In some embodiments, the solid state memory is disposed between the interface controller 120 and the read channel circuit 110 and operates as a pass through to the disk platter 178, e.g., when requested data is not available in the solid state memory or when the solid state memory does not have sufficient storage to hold a newly written data set. A variety of storage systems including disk platter 178 and solid state memory are furnished in embodiments of the disclosure.

Figure 2:
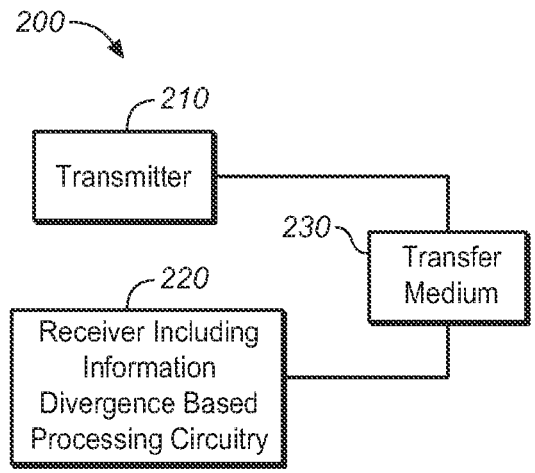
FIG. 2 is a block diagram that illustrates a data transmission system having information divergence based data processing circuitry in accordance with embodiments of the disclosure.

Turning to FIG. 2, a data transmission system 200 including a receiver 220 having information divergence based data processing circuitry is shown in accordance with embodiments of the disclosure. Data transmission system 200 includes a transmitter 210 that is operable to transmit encoded information via a transfer medium 230. The encoded data is received from transfer medium 230 by a receiver 220. Receiver 220 processes the received input to yield the originally transmitted data.

As part of processing the received information, receiver 220 applies a data detection algorithm to the received data set to yield a detected output. Soft information from the detected output is used to calculate a quality metric. In some embodiments, the quality metric is an information divergence. Later applications of the data detection algorithm and a data decode algorithm are prioritized based at least in part on the quality metric. In some embodiments, the read channel circuit is implemented similar to that discussed in relation to FIG. 3 below. In some embodiments, the read channel circuit is operated similar to the methods discussed below in relation to FIGS. 4A and 4B.

Figure 3:
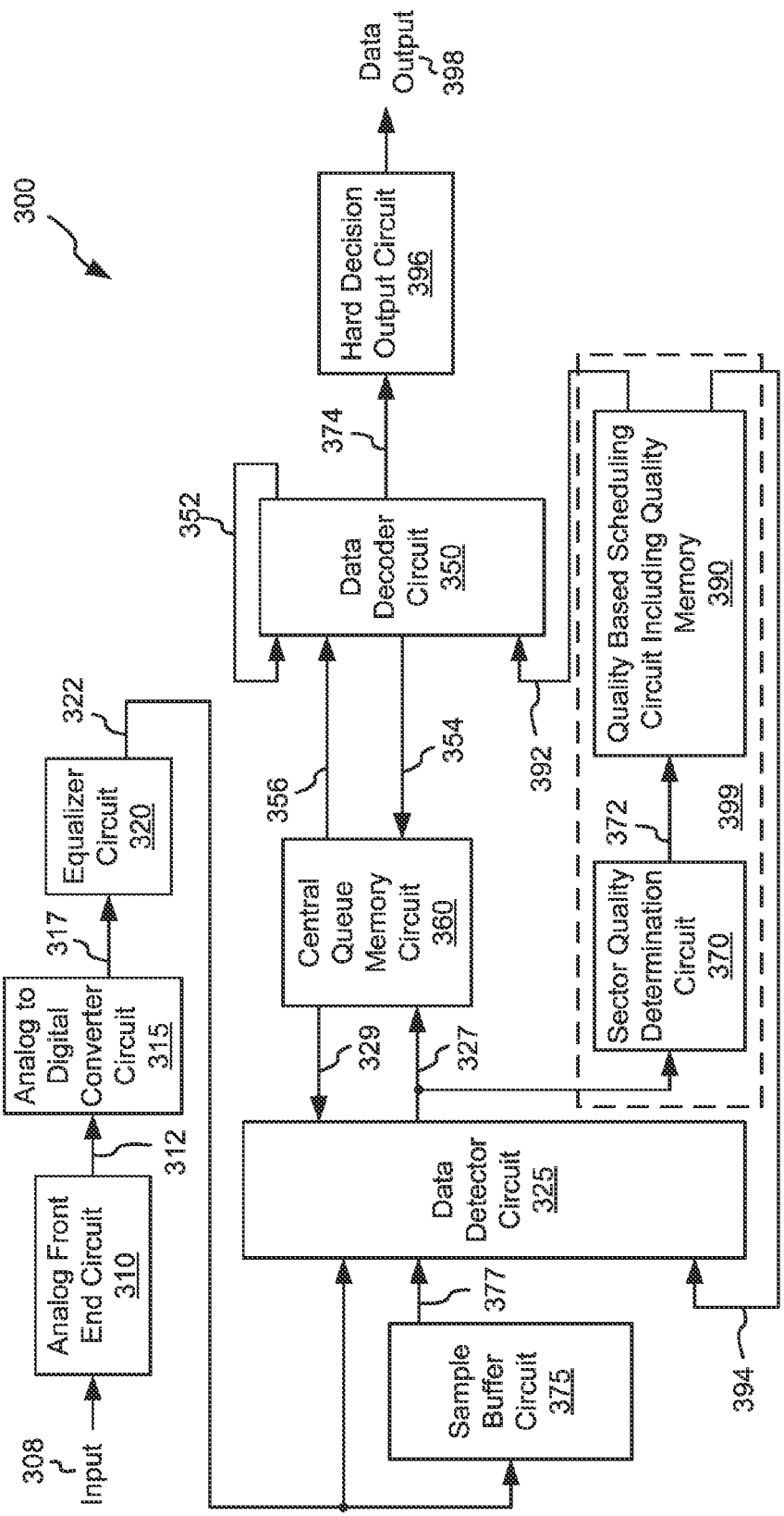
FIG. 3 is a block diagram that illustrates a data processing circuit having divergence based data processing, circuitry in accordance with embodiments of the disclosure.

Referring now to FIG. 3, a data processing circuit 300 includes a data processing circuit 399 (shown using dashed lines in the accompanying figure) in accordance with embodiments of the disclosure. Data processing circuit 300 includes an analog front end circuit 310 that receives an analog signal 308. The analog front end circuit 310 processes the analog signal 308 and provides a processed analog signal 312 to an analog to digital converter circuit 315. In some embodiments, the analog front end circuit 310 includes, but is not necessarily limited to, an analog filter and an amplifier circuit. A variety of circuitry can be included with the analog front end circuit 310 in accordance with embodiments of the disclosure. In some embodiments, the analog input signal 308 is derived from a read/write head assembly (not shown) that is disposed in relation to a storage medium (not shown). In some embodiments, the analog input signal 308 is derived from a receiver circuit (not shown) that is operable to receive a signal from a transmission medium (not shown). In some embodiments, the transmission medium is wired. In some embodiments, the transmission medium is wireless.

The analog to digital converter circuit 315 converts processed analog signal 312 into a corresponding series of digital samples 317. The analog to digital converter circuit 315 is a circuit configured for producing digital samples corresponding to an analog input signal. A variety of analog to digital converter circuits can be used in accordance with embodiments of the disclosure. Digital samples 317 are provided to an equalizer circuit 320. The equalizer circuit 320 applies an equalization algorithm to digital samples 317 to yield an equalized output 322. In some embodiments, the equalizer circuit 320 is a digital finite impulse response filter circuit. In embodiments of the disclosure, the equalized output 322 is received directly from a storage device in, for example, a solid state storage system. In such embodiments, the analog front end circuit 310, the analog to digital converter circuit 315 and the equalizer circuit 320 can be eliminated (e.g., when the data is received as a digital data input). The equalized output 322 is stored to a sample buffer circuit 375 that includes sufficient memory to maintain one or more codewords until processing of the codewords is completed. The codewords are processed through a data detector circuit 325 and a data decoder circuit 350, which use, where warranted, multiple "global iterations," which are defined as passes through both data detector circuit 325 and data decoder circuit 350. In embodiments of the disclosure, "local iterations," which are defined as passes through data decoder circuit 350 during a given global iteration, are also used. Sample buffer circuit 375 stores the received data as buffered data 377.

Data detector circuit 325 can comprise various data detector circuits configured for producing a detected output 327. In some embodiments, the data detector circuit 325 includes, but is not necessarily limited to, a Viterbi algorithm detector circuit or a maximum a posteriori detector circuit. A variety of data detector circuits can be used in accordance with embodiments of the disclosure. In some embodiments, the detected output 325 includes both hard decisions and soft decisions. The terms "hard decisions" and "soft decisions" are used in their broadest sense. In particular, the term "hard decisions" is used to refer to outputs indicating an expected original input value a binary '1' or '0', or a non-binary digital value), and the term "soft decisions" is used to indicate a likelihood that corresponding hard decisions are correct. A variety of hard decisions and soft decisions are used in accordance with embodiments of the disclosure.

The detected output 327 is provided to a central queue memory circuit 360 that operates to buffer data passed between the data detector circuit 325 and the data decoder circuit 350. When the data decoder circuit 350 is available, the data decoder circuit 350 receives the detected output 327 from the central queue memory 360 as a decoder input 356. The data decoder circuit 350 applies a data decoding algorithm to the decoder input 356 in an attempt to recover originally written data. The result of the data decoding algorithm is provided as a decoded output 354. Similar to the detected output 327, the decoded output 354 can include both hard decisions and soft decisions. For example, in some embodiments the data decoder circuit 350 comprises various data decoder circuits configured for applying a decoding algorithm to a received input, in embodiments of the disclosure, the data decoder circuit 350 comprises, but is not necessarily limited to, a low density parity check decoder circuit or a Reed Solomon decoder circuit. A variety of data decoder circuits can be used in accordance with embodiments of the disclosure. Where the original data is recovered (e.g., the data decoding algorithm converges) and/or a timeout condition occurs, the data decoder circuit 350 is configured to provide the result of the data decoding algorithm as a data output 374. The data output 374 is provided to a hard decision output circuit 396 where the data is reordered before providing a series of ordered data sets as a data output 398.

In embodiments of the disclosure, one or more iterations through the combination of the data detector circuit 325 and the data decoder circuit 350 are made in an effort to converge on the originally written data set. As mentioned above, processing through both the data detector circuit and the data decoder circuit is referred to as a "global iteration." For the first global iteration, the data detector circuit 325 applies the data detection algorithm without guidance from a decoded output. For subsequent global iterations, the data detector circuit 325 applies the data detection algorithm to the buffered data 377 as guided by the decoded output 354. The decoded output 354 is received from the central queue memory 360 as a detector input 329.

During each global iteration, it is possible for the data decoder circuit 350 to make one or more local iterations including application of the data decoding algorithm to the decoder input 356. For the first local iteration, the data decoder circuit 350 applies the data decoder algorithm without guidance from a decoded output 352. For subsequent local iterations, the data decoder circuit 350 applies the data decoding algorithm to the decoder input 356 as guided by a previous decoded output 352. A default number of iterations is allowed for each global iteration. In some embodiments, the default number is ten (10) iterations.

The selection of which buffered data 377 or detector output 329 will be processed next by the data detector circuit 325, and which decoder input 356 will be processed next by the data decoder circuit 350, is controlled at least in part by a quality based scheduling circuit 390. The quality based scheduling circuit 390 includes a quality memory operable to hold a quality metric associated with each respective data set awaiting processing. In particular, the quality based scheduling circuit 390 provides a decoder selector signal 392 to the data decoder circuit 350 that identifies which decoder input 356 in the central queue memory circuit 360 is to be selected next for processing by the data decoder circuit 350. In addition, the quality based scheduling circuit 390 provides a detector selector signal 394 to the data detector circuit 325 that identifies which detector input 329 from the central queue memory circuit 360 and/or the buffered data 377 is to be selected next for processing by the data detector circuit 325.

The quality memory in the quality based scheduling circuit 390 stores a quality metric 372 calculated by a sector quality determination circuit 370 corresponding to each sector of data maintained in the central queue memory circuit 360. In particular, the sector quality determination circuit 370 receives a detected output 327 for a given sector and calculates a corresponding quality metric based upon the detected output 327. The resulting quality metric is provided as a quality metric 372 to the quality memory of the quality based scheduling circuit 390.

The quality metric 372 is calculated using an information divergence algorithm as information divergence has been found to be a reasonable proxy for the quality of data included in a sector. The information divergence calculation relies on the soft data (e.g., tog likelihood ratio (LLR) data) from the detected output 327. This soft data acts well as a random variable with a certain probability distribution. Calculating the information divergence relies on a Bregman divergence calculation in accordance with the following equation:

$$B(p \mid q) = \sum_{j=0}^{n-1} \sum_{i=0}^{M} [\text{LLR\_p\_j}(i) - \text{LLR\_q\_j}(i)],$$

where p and q are two probability mass functions, n is the number of elements, and M is the number of LLR values for each symbol. For example, in a two bit symbol system, M is equal to four (e.g., LLR[0], LLR[1], LLR[3]). A logarithm taken on the coefficients and normalized to (e.g., subtracted by) the log(p(i))(log(q(j))) and p_k(j)(q_k(j)) is the largest coefficient in p_k(q_k). The resulting vectors p' and q' are defined in the equations below:

$$p' = [LLR\_p(0), LLR\_p(1), \ldots LLR\_p(n)]; \text{ and}$$

$$q' = [LLR\_q(0), LLR\_q(1), \ldots LLR\_q(n)],$$

where n is the number of soft data elements in a sector of data received as the detected output 327. These two vectors, p and q, are used in the Bregman divergence calculation set forth above. The vector p is the actual soft data received as part of detected output 327, and the vector q is an ideal distribution.

An example uses a GF(4) data processing system (e.g., a two bit non-binary processing system), where an output in the detected output 327 is '0,' '1,' '2,' or '3' with four corresponding soft data values LLR0, LLR1, LLR2, LLR3, respectively. In this example, let the true value (e.g., ideal distribution) be x0 with an LLR value of [0, −30, −30, −30], and let the corresponding hard decision be x1 with an LLR value of [0, −30, −30, −30], e.g., where '−30' indicates less likely than '0.' Ideally, it would be desirable to calculate the information divergence between x and x0 to get a perfect measurement of the difference of the probability mass functions between x and x0. The divergence between x and x1 can be calculated as a proxy of the divergence between x and x0. From a practical standpoint, the divergence between x and x1 is almost equal to the divergence between x and x0, e.g., where the hard decision error count is low and the hard decision is incorrect. The result of the Bregman divergence calculation is summed over a number of instances and the result is provided as the quality metric 372. The quality metric 372 is stored in relation to the sector from which it was calculated.

The following pseudocode shows an example operation for providing quality metric 372 using the sector quality determination circuit 370:

```
quality metric 372 = 0 // Initialize the quality metric //
For (i=0 to (n−1)) {
    // M is the number of LLR values for each hard decision value, e.g.,
        4 for a 2 bit non-binary //
    LLR_x = Array of detected output 327(i*M to i*(2M−1));
    // Identify the hard decision value that corresponds to the highest
        value of LLR_x //
    HD_x = index of LLR_x with the greatest LLR value;
    // Set all LLRs to least likely values //
    LLR_x1 = [−31, −31, −31, −31];
    // Set LLR value corresponding to the HD_x to a more likely value //
    LLR_x1 (HD_x) = 0;
    // Calculate quality metric 372//
    quality metric 372 = quality metric 372 + Information Divergence
    Value:
}
```

In this example, the information divergence value is calculated in accordance with the Bregman divergence calculation discussed above.

In operation, the quality based scheduling circuit 390 schedules the detected output maintained in the central queue memory circuit 360 that exhibits a predetermined characteristic of the quality metric 372 as the next sector for processing by the data decoder circuit 350. In some embodiments, the equalized output having the quality metric with the highest value is selected. Similarly, the quality based scheduling circuit 390 schedules the decoded output maintained in the central queue memory circuit 360 that exhibits the highest value of the quality metric 372 as the next sector for processing by the data detector circuit 325. Other priority algorithms based upon information divergence can be used in embodiments of the disclosure. For example, in some embodiments, the number of unsatisfied checks remaining after the first pass through the data decoder circuit 350 is used for scheduling after completion of the first global iteration for a given sector. For the second and later global iterations, the quality metric 372 is used for scheduling.

Figure 4A:
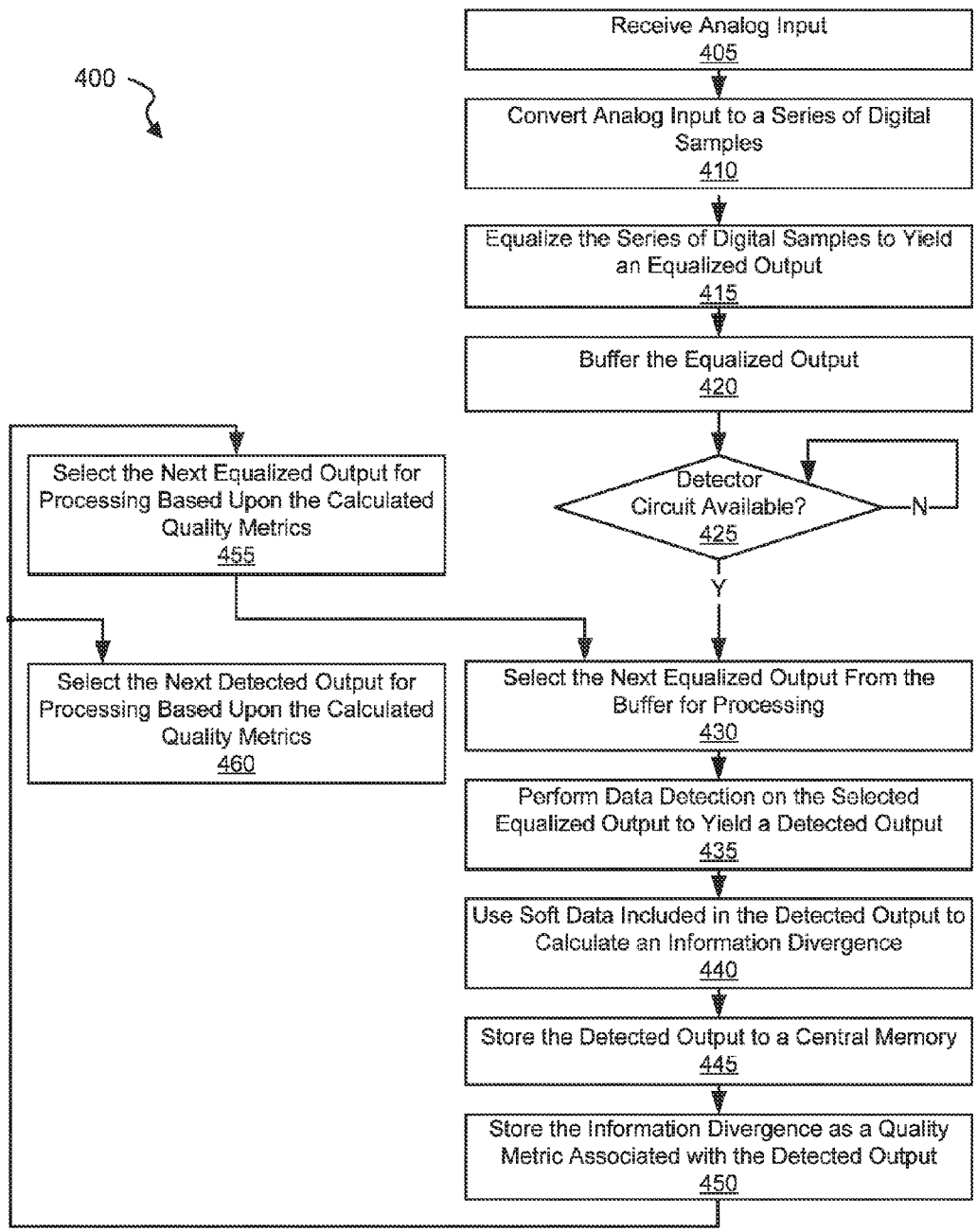
FIGS. 4A and 4B are flow diagrams illustrating a method for divergence based data processing in accordance with embodiments of the disclosure.
Figure 4B:
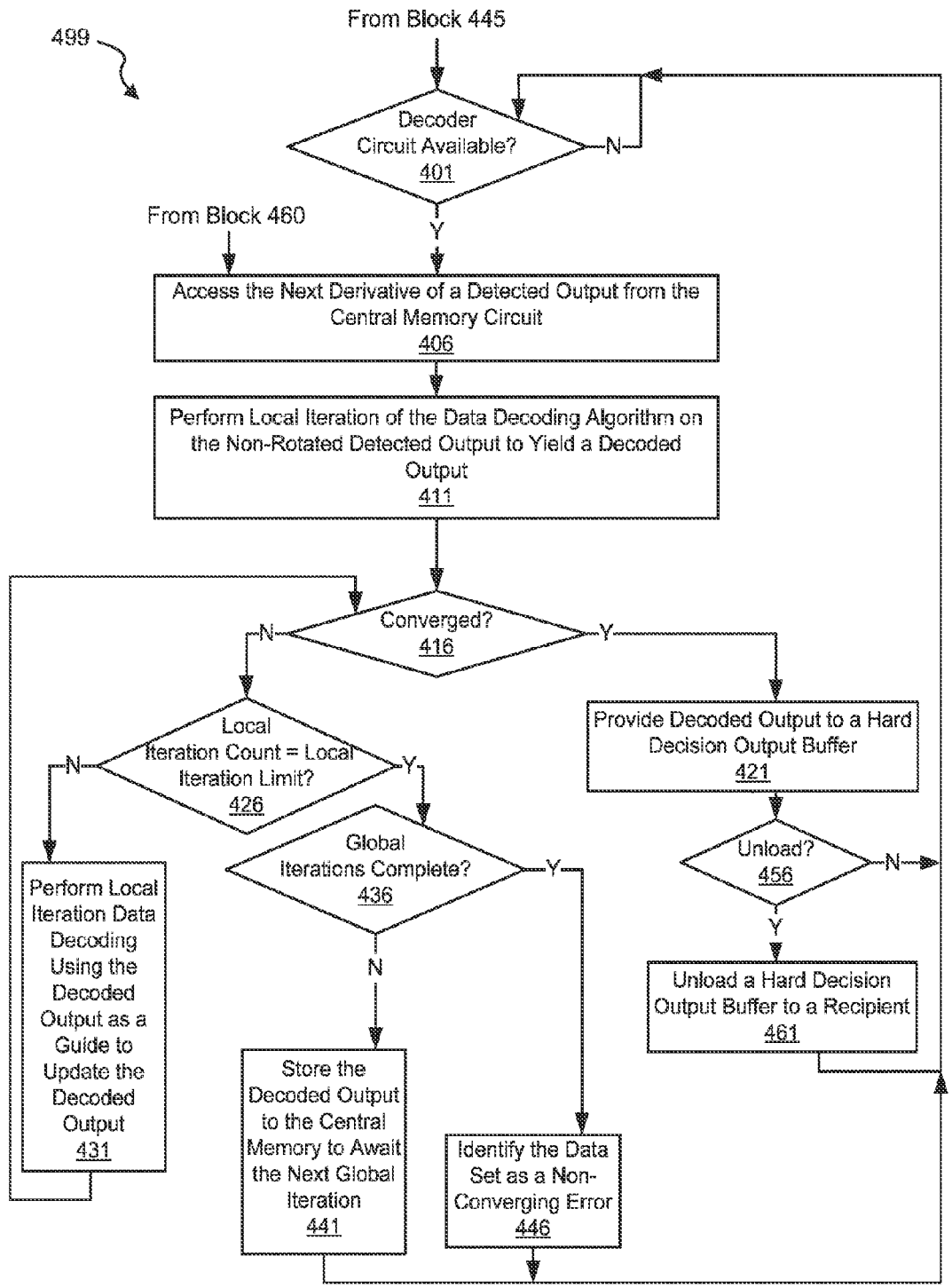

Referring to FIGS. 4A and 4B, flow diagrams 400 and 499 illustrate a method for divergence based data processing in accordance with embodiments of the disclosure. Following flow diagram 400 of FIG. 4A, an analog input is received (Block 405). In some embodiments, the analog input is derived from, for example, a storage medium or a data transmission channel. A variety of sources can be used to provide the analog input in accordance with embodiments of the disclosure. The analog input is converted to a series of digital samples (Block 410). This conversion is accomplished using an analog to digital converter circuit or system. Of note, various circuits configured for converting an analog signal into a series of digital values representing the received analog signal may be used. The resulting digital samples are equalized to yield an equalized output (Block 415). In embodiments of the disclosure, the equalization is accomplished using a digital finite impulse response circuit. However, the digital finite impulse response circuit is provided by way of example only and is not meant to be restrictive of the disclosure. Thus, a variety of equalizer circuits may be used in place of a digital finite impulse response circuit to perform equalization in accordance with embodiments of the disclosure. The equalized output is buffered (Block 420).

It is determined whether a data detector circuit is available to process a data set (Block 425). Where a data detector circuit is available to process a data set (Block 425), the next equalized output from the buffer is accessed for processing (Block 430). In embodiments of the disclosure, the data detector circuit is a Viterbi algorithm data detector circuit or a maximum a posteriori data detector circuit. The next equalized output selected for processing by the available data detector circuit (Block 430) is selected based upon a quality metric that is calculated as more fully discussed below in relation to Block 440. A data detection algorithm is applied to the accessed equalized output by the data detector circuit to yield a detected output (Block 435).

Soft data included in the detected output is used to calculate an information divergence value (Block 440). This information divergence value is calculated in accordance with the following pseudocode:

```
Information Divergence Value = 0 // Initialize the information divergence
value //
For (i=0 to (n−1)) {
    // M is the number of LLR values for each hard decision value, e.g.,
        4 for a 2 bit non-binary //
    LLR_x = Array of the detected output(i*M to i*(2M−1));
    // Identify the hard decision value that corresponds to the highest
        value of LLR_x //
    HD_x = index of LLR_x with the greatest LLR value;
    // Set all LLRs to least likely values //
    LLR_x1=[−31, −31, −31, −31];
    // Set LLR value corresponding to the HD_x to a more likely value //
    LLR_x1 (HD_x) = 0;
    // Calculate Information Divergence Value //
    Information Divergence Value = Information Divergence Value +
        Update Value;
}
```

In this example, the update value is calculated in accordance with the Bregman divergence calculation discussed above in relation to FIG. 3.

The detected output is stored to a central queue memory circuit where it awaits processing by a data decoder circuit (Block 445). In addition, the information divergence value calculated in Block 440 is stored as a quality metric for the equalized output recently processed through the data detected output (Block 450). This quality metric is used to select which equalized output will be processed next by the data detector circuit (Block 455). In embodiments of the disclosure, the equalized output having the quality metric with a predetermined characteristic is selected to be accessed from the buffer and processed by the data detector circuit. In some embodiments, the equalized output having the quality metric with the highest value is selected. Where the only equalized outputs available in the sample buffer circuit have not passed through a first global iteration and do not include a quality metric, one of the available equalized outputs is selected based upon the time that the equalized output has been maintained in the sample buffer. Other priority algorithms based upon information divergence may be used in accordance with embodiments of the disclosure. For example, in some embodiments, the number of unsatisfied checks remaining after the first pass through data decoder circuit 350 is used for scheduling after completion of the first global iteration for a given sector. For the second and later global iterations, the quality metric of Block 450 is used for scheduling.

In addition, the next detected output maintained in the central queue memory circuit is selected based upon the quality metric of Block 450 (Block 460). In embodiments of the disclosure, the detected output maintained in the central queue memory circuit having the quality metric with a predetermined characteristic is selected to be accessed from the central queue memory circuit for processing by a data decoder circuit. In some embodiments, the detected output maintained in the central queue memory circuit having the quality metric with the highest value is selected to be accessed from the central queue memory circuit for processing by a data decoder circuit. Other priority algorithms based upon information divergence can be used in accordance with embodiments of the disclosure.

Referring now to FIG. 4B, in flow diagram 499 it is determined whether a data decoder circuit is available (Block 401), e.g., in parallel to the previously described data detection process of FIG. 4A. In some embodiments, the data decoder circuit is a low density parity check data decoder circuit. Where the data decoder circuit is available (Block 401) the next derivative of a detected output is selected from the central queue memory circuit (Block 406). In embodiments of the disclosure, the derivative of the detected output is an interleaved (shuffled) version of a detected output from the data detector circuit. The selected derivative of the detected output is performed based upon a selection indicator derived from quality metric information as discussed above in relation to Block 460. A first local iteration of a data decoding algorithm is applied by the data decoder circuit to the selected detected output to yield a decoded output (Block 411). It is then determined whether the decoded output converged (e.g., resulted in the originally written data as indicated by the lack of remaining unsatisfied checks) (Block 416).

Where the decoded output converged (Block 416), the decoded output is provided as a decoded output codeword to a hard decision output buffer (including but not limited to a re-ordering buffer) (Block 421). It is determined whether the received output codeword is either sequential to a previously reported output codeword, in which case reporting the currently received output codeword immediately would be in order, or that the currently received output codeword completes an ordered set of a number of codewords, in which case reporting the completed, ordered set of codewords would be in order (Block 456). Where the currently received output codeword is either sequential to a previously reported codeword or completes an ordered set of codewords (Block 456), the currently received output codeword and, where applicable, other codewords forming an in order sequence of codewords are provided to a recipient as an output (Block 461).

In embodiments of the disclosure where the decoded output fails to converge (e.g., errors remain) (Block 416), it is determined whether the number of local iterations already applied equals the maximum number of local iterations (Block 426). In some embodiments, a default number of local iterations (including but not limited to seven (7) local iterations) is provided for each global iteration. However, seven (7) local iterations are provided by way of example only and are not meant to be restrictive of the disclosure. Thus, another default number of local iterations can be used in accordance with embodiments of the disclosure. Where another local iteration is allowed (Block 426), the data decoding algorithm is applied to the selected data set using the decoded output as a guide to update the decoded output (Block 431). The processes of blocks starting at Block 416 are repeated for the next local iteration.

When all of the local iterations have occurred (Block 426), determination is made whether all of the global iterations have been applied to the currently processing data set (Block 436). Where all of the global iterations have not completed (Block 436), the decoded output is stored to the central queue memory circuit to await the next global iteration (Block 441). In embodiments of the disclosure where the number of global iterations has been completed (Block 436), an error is indicated and the data set is identified as non-converging (Block 446).

Figure 5:
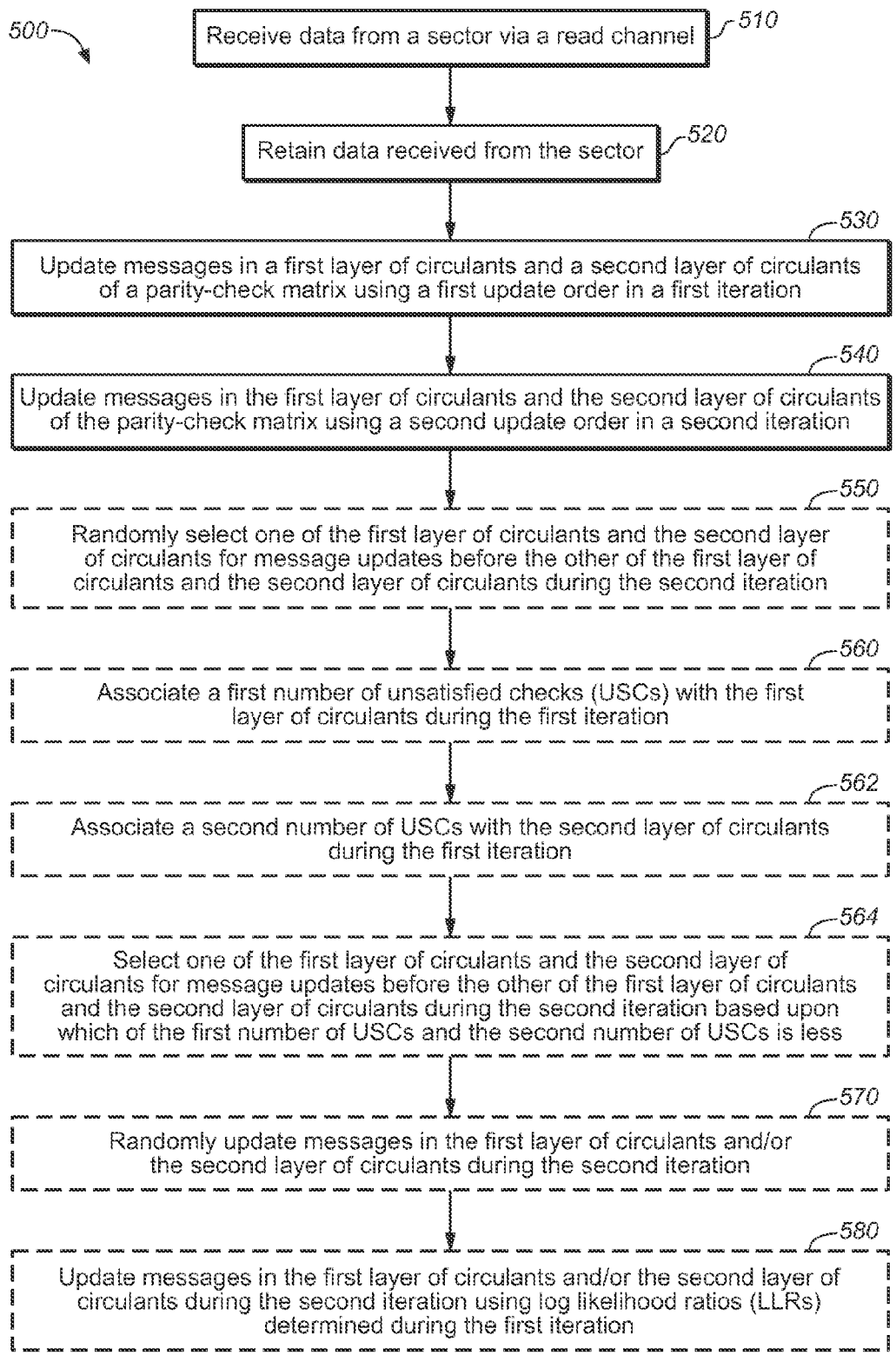
FIG. 5 is a flow diagram illustrating a method for changing the order of message updates for different layers and/or for circulants within a particular layer of a parity-check matrix (e.g., for a layered data detector) in accordance with embodiments of the disclosure.

Different message update orders can affect error correction capability for retrieving data from sectors of a storage system, such as the sectors of storage media, including but not necessarily limited to, an HDD disk platter and tape. For example, the order of message updates for different layers, as well as the order of message updates for circulants within a particular layer, can affect the error correction capability. FIG. 5 illustrates a method 500 in accordance with embodiments of the disclosure that is employed by a read channel, such as the read channel circuit 110 of FIG. 1 and/or the data processing circuit 300 of FIG. 3, to change the order of message updates for different layers and/or the order of message updates for circulant matrices (hereinafter circulants) within a particular layer of a parity-check matrix (e.g., for a layered data detector). In embodiments of the disclosure, the storage system 100 receives data from the sectors via the read channel 110 and uses a layered data decoder (e.g., the data decoder circuit 350) to recover data from the sectors. In some embodiments, the data decoder circuit 350 comprises a parity-check matrix, with three layers of circulants, and twenty-eight (28) circulants in each layer.

In embodiments of the disclosure, the method 500 is used to implement message update reordering for retained sector reprocessing so that more than one processing iteration is implemented for a failed sector, e.g., in the end of a track. This technique can improve the chance of failure recovery in an RSR system. The method 500 is configured to update messages in different circulant layers of the data decoder's parity-check matrix. In some embodiments, the method 500 uses one message update order in a processing iteration, and different message update orders in subsequent reprocessing iterations. In some embodiments, the method 500 uses layer reordering. For example, messages in one layer of circulants are updated before messages in another layer of circulants during one iteration, and messages in the second layer of circulants are updated before messages in the first layer of circulants during another iteration. In some embodiments, randomized reordering is used to reorder layers in the reprocessing stage of RSR. For example, messages in a first layer of circulants are updated before messages in a second layer of circulants during a processing iteration. Then, the second layer of circulants is randomly selected for message updates before the first layer of circulants during a reprocessing iteration. It should be noted that for the purposes of the disclosure, the term "random" is used within the context of some embodiments to refer to parameter values that are determined randomly, pseudo-randomly (e.g., deterministically in a uniform manner), and so forth.

Additionally, in some embodiments, the method 500 uses error event based reordering to reorder message updates for layers in the reprocessing stage of RSR. In embodiments of the disclosure, both y-samples and unsatisfied check (USC) indices are saved for the last global iteration. In the reprocessing stage of RSR, the number of USCs in each layer is calculated, and the layers are sorted according to the number of USCs in each layer. In some embodiments, layers with fewer USCs are processed earlier, and layers with more USCs are processed later. In each local iteration, as the USCs are updated, the number of USCs in each layer is calculated based on the USC indices from a previous local iteration, and the layer is sorted for the current iteration. Thus, the order of message updating can change from one local iteration to another local iteration. In a particular example, a number of USCs is associated with one layer of circulants and another number of USCs is associated with another layer of circulants during one iteration a processing iteration). Then, a layer of circulants is selected for message updates before another layer of circulants during a subsequent iteration (e.g., a reprocessing iteration). In embodiments of the disclosure, the selection of a particular layer of circulants for message updates is based upon which layer of circulants has the least number of associated USCs.

In some embodiments, the method 500 uses circulant reordering for RSR. Messages in one layer of circulants are updated before messages in another layer of circulants during one iteration (e.g., a processing iteration) and during another iteration (e.g., a reprocessing iteration), while messages within a particular layer of circulants are updated differently from one iteration to another. In a particular example, randomized reordering is used to reorder the circulants in a layer. In some embodiments, messages within a particular layer of circulants are updated sequentially during one iteration and randomly during another iteration.

Additionally, in some embodiments, the method 500 uses symbol log likelihood ratio (LLR) quality based reordering to reorder message updates for circulants within a particular layer in the reprocessing state of RSR. For example, in one stage of RSR, samples are saved for a failed sector. In a reprocessing stage of RSR, the same message update order is used in the first local iteration of the first global iteration. For a second local iteration (and possibly additional local iterations), the reliability of LLRs in a previous local iteration is calculated for each circulant, and the circulants are sorted according to the LLR quality metrics. Circulants with better quality metrics are processed earlier, and circulants with worse quality metrics are processed later. In each local iteration, as the total LLRs are updated, quality metrics in circulants based on the LLRs from a previous local iteration are calculated, and the circulants are sorted for the current local iteration. Thus, the order of message updates can change from one local iteration to another local iteration. In some embodiments, messages in a layer of circulants are updated during a subsequent iteration (e.g., a reprocessing iteration) using LLRs determined during a prior iteration (e.g., a processing iteration). In embodiments of the disclosure, the reliability metric used is the quality metric 372 described with reference to the discussion of FIG. 3.

As shown, data is received from a sector via a read channel (Block 510). Then, data is retained from the sector (Block 520). For example, RSR techniques are used to retain data from one or more sectors. Next, messages in a first layer of circulants and a second layer of circulants of a parity-check matrix are updated using a first update order in a first iteration (Block 530). Then, messages in the first layer of circulants and the second layer of circulants of the parity-check matrix are updated using a second update order in a second iteration (Block 540). In embodiments of the disclosure, the second update order is different from the first update order.

In embodiments of the disclosure, layer reordering is used for retained sector reprocessing. In some embodiments, one of the first layer of circulants and the second layer of circulants is randomly selected for message updates before the other of the first layer of circulants and the second layer of circulants during the second iteration (Block 550). In embodiments of the disclosure, a first number of unsatisfied checks (USCs) (e.g., USC indices) is associated with the first layer of circulants during the first iteration (Block 560), a second number of USCs is associated with the second layer of circulants during the first iteration (Block 562), and one of the first layer of circulants and the second layer of circulants is selected for message updates before the other of the first layer of circulants and the second layer of circulants during the second iteration based upon which of the first number of USCs and the second number of USCs is smaller (Block 564). Circulant reordering can also be used for retained sector reprocessing. In some embodiments, messages in the first layer of circulants and/or the second layer of circulants are randomly updated during the second iteration (Block 570). In embodiments of the disclosure, messages in the first layer of circulants and/or the second layer of circulants are updated during the second iteration using a reliability metric, such as log likelihood ratios (LLRs) determined during the first iteration (Block 580). The reliability metric can be the quality metric 372 described with reference to the discussion of FIG. 3.

Generally, any of the functions described herein can be implemented using hardware (e.g., fixed logic circuitry such as integrated circuits), software, firmware, manual processing, or a combination thereof. Thus, the blocks discussed in the above disclosure generally represent hardware (e.g., fixed logic circuitry such as integrated circuits), software, firmware, or a combination thereof. In embodiments of the disclosure that manifest in the form of integrated circuits, the various blocks discussed in the above disclosure can be implemented as integrated circuits along with other functionality. Such integrated circuits can include all of the functions of a given block, system or circuit, or a portion of the functions of the block, system or circuit. Further, elements of the blocks, systems or circuits can be implemented across multiple integrated circuits. Such integrated circuits can comprise various integrated circuits including, but not limited to: a system on a chip (SoC), a monolithic integrated circuit, a flip chip integrated circuit, a multichip module integrated circuit, and/or a mixed signal integrated circuit. In embodiments of the disclosure that manifest in the form of software, the various blocks discussed in the above disclosure represent executable instructions (e.g., program code) that perform specified tasks when executed on a processor. These executable instructions can be stored in one or more tangible computer readable media. In some such embodiments, the entire system, block or circuit can be implemented using its software or firmware equivalent. In some embodiments, one part of a given system, block or circuit can be implemented in software or firmware, while other parts are implemented in hardware.

Although embodiments of the disclosure have been described in language specific to structural features and/or methodological acts, it is to be understood that the subject matter defined in the appended claims is not necessarily limited to the specific embodiments described. Although various configurations are discussed the apparatus, systems, subsystems, components and so forth can be constructed in a variety of ways without departing from teachings of this disclosure. Rather, the specific features and acts are disclosed as embodiments of implementing the claims.

What is claimed is:

1. A system for recovering data from a plurality of sectors using a layered data decoder, the system comprising:
    a processor configured to receive data from a plurality of sectors via a read channel and recover data from the plurality of sectors using a layered data decoder; and
    a memory configured to retain data received from at least one of the plurality of sectors, the memory having computer executable instructions stored thereon, the computer executable instructions configured for execution by the processor to:
    update a plurality of messages in a first layer of circulant matrices and a second layer of circulant matrices of a parity-check matrix for the layered data decoder using a first update order in a first iteration, and
    update the plurality of messages in the first layer of circulant matrices and the second layer of circulant matrices of the parity-check matrix using a second update order in a second iteration, where the second update order is different from the first update order.

2. The system as recited in claim 1, wherein the parity-check matrix further comprises a third layer of circulant matrices, the computer executable instructions configured for execution by the processor to update the plurality of messages in the third layer of circulant matrices in the first iteration and the second iteration.

3. The system as recited in claim 1, wherein each one of the first layer, the second layer, and the third layer of the parity-check matrix comprises at least twenty-eight (28) circulant matrices.

4. The system as recited in claim 1, wherein messages in the first layer of circulant matrices are updated before messages in the second layer of circulant matrices during the first iteration and messages in the second layer of circulant matrices are updated before messages in the first layer of circulant matrices during the second iteration.

5. The system as recited in claim 1, wherein one of the first layer of circulant matrices and the second layer of circulant matrices is randomly selected for message updates before the other of the first layer of circulant matrices and the second layer of circulant matrices during the second iteration.

6. The system as recited in claim 1, wherein a first number of unsatisfied checks unsatisfied checks is associated with the first layer of circulant matrices and a second number of unsatisfied checks is associated with the second layer of circulant matrices during the first iteration, and one of the first layer of circulant matrices and the second layer of circulant matrices is selected for message updates before the other of the first layer of circulant matrices and the second layer of circulant matrices during the second iteration based upon which of the first number of unsatisfied checks and the second number of unsatisfied checks is less.

7. The system as recited in claim 1, wherein messages in the first layer of circulant matrices are updated before messages in the second layer of circulant matrices during the first iteration and during the second iteration.

8. The system as recited in claim 1, wherein messages in at least one of the first layer of circulant matrices or the second layer of circulant matrices are updated randomly during the second iteration.

9. The system as recited in claim 1, wherein messages in at least one of the first layer of circulant matrices or the second layer of circulant matrices are updated during the second iteration using a plurality of log likelihood ratios determined during the first iteration.

10. The system as recited in claim 1, wherein the system is fabricated in an integrated circuit.

11. A computer-readable storage medium having computer executable instructions for recovering data from a plurality of sectors using a layered data decoder, the computer executable instructions comprising:
    receiving data from a plurality of sectors via a read channel;
    retaining data received from at least one of the plurality of sectors;
    updating a plurality of messages in a first layer of circulant matrices and a second layer of circulant matrices of a parity-check matrix for a layered data decoder using a first update order in a first iteration; and
    updating the plurality of messages in the first layer of circulant matrices and the second layer of circulant matrices of the parity-check matrix using a second update order in a second iteration, where the second update order is different from the first update order.

12. The computer-readable storage medium as recited in claim 11, wherein the parity-check matrix further comprises a third layer of circulant matrices, the computer executable instructions further comprising updating the plurality of messages in the third layer of circulant matrices in the first iteration and the second iteration.

13. The computer-readable storage medium as recited in claim 11, the computer executable instructions further comprising randomly selecting one of the first layer of circulant matrices and the second layer of circulant matrices for message updates before the other of the first layer of circulant matrices and the second layer of circulant matrices during the second iteration.

14. The computer-readable storage medium as recited in claim 11, the computer executable instructions further comprising:
    associating a first number of unsatisfied checks with the first layer of circulant matrices during the first iteration;
    associating a second number of unsatisfied checks with the second layer of circulant matrices during the first iteration;
    selecting one of the first layer of circulant matrices and the second layer of circulant matrices for message updates before the other of the first layer of circulant matrices and the second layer of circulant matrices during the second iteration based upon which of the first number of unsatisfied checks and the second number of unsatisfied checks is less.

15. The computer-readable storage medium as recited in claim 11, the computer executable instructions further comprising randomly updating messages in at least one of the first layer of circulant matrices or the second layer of circulant matrices during the second iteration.

16. The computer-readable storage medium as recited in claim 11, the computer executable instructions further comprising updating messages in at least one of the first layer of circulant matrices or the second layer of circulant matrices during the second iteration using a plurality of log likelihood ratios determined during the first iteration.

17. A computer-implemented method for recovering data from a plurality of sectors using a layered data decoder, the computer-implemented method comprising:

receiving data from a plurality of sectors via a read channel;

retaining data received from at least one of the plurality of sectors; and causing a processor to update a plurality of messages in a first layer of circulant matrices, a second layer of circulant matrices, and a third layer of circulant matrices of a parity-check matrix for a layered data decoder using a first update order in a first iteration and update the plurality of messages in the first layer of circulant matrices, the second layer of circulant matrices, and the third layer of circulant matrices of the parity-check matrix using a second update order in a second iteration, where the second update order is different from the first update order.

18. The computer-implemented method as recited in claim 17, further comprising randomly selecting one of the first layer of circulant matrices and the second layer of circulant matrices for message updates before the other of the first layer of circulant matrices and the second layer of circulant matrices during the second iteration.

19. The computer-implemented method as recited in claim 17, further comprising:

associating a first number of unsatisfied checks with the first layer of circulant matrices during the first iteration;

associating a second number of unsatisfied checks with the second layer of circulant matrices during the first iteration; and selecting one of the first layer of circulant matrices and the second layer of circulant matrices for message updates before the other of the first layer of circulant matrices and the second layer of circulant matrices during the second iteration based upon which of the first number of unsatisfied checks and the second number of unsatisfied checks is less.

20. The computer-implemented method as recited in claim 17, further comprising randomly updating messages in at least one of the first layer of circulant matrices or the second layer of circulant matrices during the second iteration.

21. The computer-implemented method as recited in claim 17, further comprising updating messages in at least one of the first layer of circulant matrices or the second layer of circulant matrices during the second iteration using a plurality of log likelihood ratios determined during the first iteration.

* * * * *